(12) United States Patent
Cox et al.

(10) Patent No.: US 8,016,542 B2
(45) Date of Patent: Sep. 13, 2011

(54) METHODS AND APPARATUS FOR EXTENDING THE REACH OF A DUAL SCARA ROBOT LINKAGE

(75) Inventors: Damon Keith Cox, Round Rock, TX (US); Marvin L. Freeman, Round Rock, TX (US); Jason M. Schaller, Austin, TX (US); Jeffrey C. Hudgens, San Francisco, CA (US); Jeffrey A. Brodine, Los Gatos, CA (US)

(73) Assignee: Applied Materials, Inc., Santa Clara, CA (US)

( * ) Notice: Subject to any disclaimer, the term of this patent is extended or adjusted under 35 U.S.C. 154(b) by 501 days.

(21) Appl. No.: 12/129,346

(22) Filed: May 29, 2008

(65) Prior Publication Data

US 2008/0298945 A1    Dec. 4, 2008

Related U.S. Application Data

(60) Provisional application No. 60/940,971, filed on May 31, 2007.

(51) Int. Cl.
*B25J 18/00* (2006.01)

(52) U.S. Cl. .............. 414/744.5; 74/490.01; 901/15; 901/8

(58) Field of Classification Search ............ 414/744.5; 901/15, 8; 74/490.01
See application file for complete search history.

(56) References Cited

U.S. PATENT DOCUMENTS

| | | | |
|---|---|---|---|
| 6,246,200 B1 | 6/2001 | Blumenkranz | |
| 6,485,250 B2 | 11/2002 | Hofmeister | |
| 6,669,434 B2 | 12/2003 | Namba et al. | |
| 2001/0036398 A1 | 11/2001 | Hofmeister | |
| 2005/0232744 A1* | 10/2005 | Minami et al. | 414/744.1 |
| 2006/0099063 A1 | 5/2006 | Pietrantonio et al. | |
| 2006/0245905 A1 | 11/2006 | Hudgens | |
| 2007/0116549 A1 | 5/2007 | Rice et al. | |
| 2008/0063504 A1 | 3/2008 | Kroetz et al. | |

FOREIGN PATENT DOCUMENTS

WO    WO 2008/150484    12/2008

OTHER PUBLICATIONS

International Preliminary Report on Patentability and Written Opinion of International Application No. PCT/US2008/006903 mailed Dec. 10, 2009.
International Search Report and Written Opinion of International Application No. PCT/US08/06903 mailed Sep. 15, 2008.

* cited by examiner

*Primary Examiner* — Donald Underwood
(74) *Attorney, Agent, or Firm* — Dugan & Dugan PC

(57) ABSTRACT

Methods and apparatus are provided for the use of a dual Selective Compliant Assembly Robot Arm (SCARA) robot. In some embodiments two SCARAs are provided, each including an elbow joint, wherein the two SCARAs are vertically stacked such that one SCARA is a first arm and the other SCARA is a second arm, and wherein the second arm is adapted to support a first substrate, and the first arm is adapted to extend to a full length when the second arm supports the first substrate, and wherein the first substrate supported by the second arm is coplanar with the elbow joint of the first arm, and the second arm is further adapted to move concurrently in parallel (and/or in a coordinated fashion) with the first arm a sufficient amount to avoid interference between the first substrate and the elbow joint of the first arm. Numerous other embodiments are provided.

24 Claims, 7 Drawing Sheets

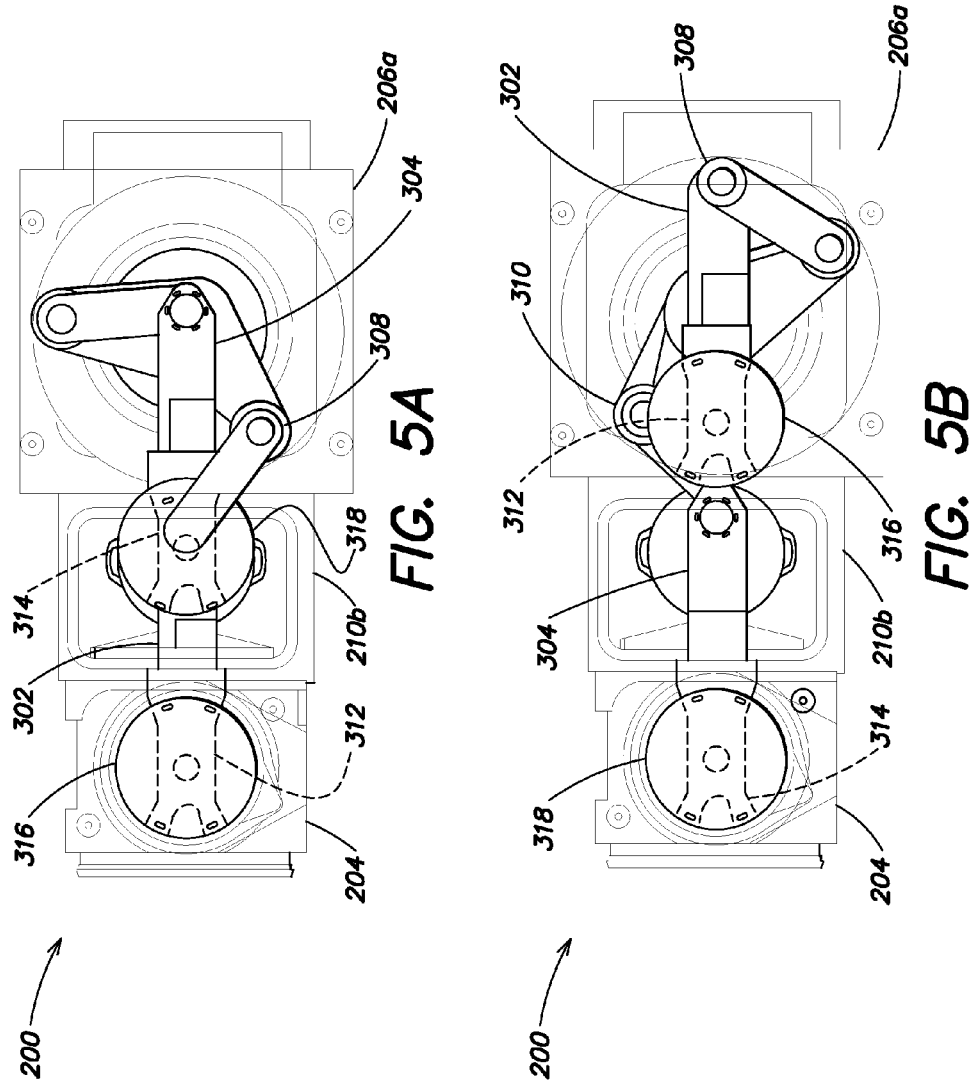

METHODS AND APPARATUS FOR EXTENDING THE REACH OF A DUAL SCARA ROBOT LINKAGE

The present application claims priority to U.S. Provisional Patent Application Ser. No. 60/940,971, filed May 31, 2007 and entitled "Methods and Apparatus for Extending the Reach of a Dual Scara Robot Linkage", which is hereby incorporated herein by reference in its entirety for all purposes.

FIELD OF THE INVENTION

The present invention is directed to the use of robots in substrate transfer chambers, and more particularly to dual SCARA robots used in extended reach applications.

BACKGROUND OF THE INVENTION

In multiple chamber electronic manufacturing systems it is desirable to have more than one semiconductor substrate in process at a time. In this way, the electronic manufacturing system is used to obtain maximum throughput. In the art, a robot arm used in an electronic manufacturing system must store one substrate or wafer, fetch and place another substrate, and then fetch and place the stored substrate. Although this improves use of the system and provides improved throughput, the robot arm itself must go through significant repetitive motion—one way to overcome the inefficiency attendant with such wasted motion is to provide a two robot arm system about a common pivot point. Each such robot arm may operate independently of the other, and improved throughput can be obtained through the increased handling capacity of the system, i.e. two arms are better than one.

A Selective Compliant Assembly Robot Arm (also known as a Selective Compliant Articulated Robot Arm) (SCARA) is a multi-axis robot arm that can access any X-Y-Z, or rather R-θ-Z, coordinate within its work envelope. The 'X' and 'Y' movements are obtained with three parallel-axis rotary joints. The vertical motion 'Z' is usually an independent linear axis at the wrist or in the base. SCARA robots are used in assembly operations where the final move to insert the part is a single vertical movement. Component insertion into printed circuit boards may be an example. This is often called "vertical assembly". Substrate transfer between processing chambers during electronic device manufacturing may be another popular application for SCARA robots.

An attribute of the SCARA is the jointed two-link arm layout, which may be similar to human arms, hence the often-used term, Articulated. This feature may allow the arm to extend into confined areas and then retract or "fold up" out of the way. This is advantageous for transferring substrates from one chamber to another or for loading/unloading process stations that are enclosed.

As larger sized substrates are used in electronic device manufacturing, the equipment (e.g., SCARA robots, processing chambers, transfer chambers, etc.) required for handling and processing the substrates must accommodate the larger substrates. However, the costs associated with simply making the equipment larger can quickly become cost prohibitive, such as the increased cost of manufacturing space, for example. Additionally, as will be further described below, larger equipment may also be undesirable as the larger volume in the processing and robot chambers, for example, may be more difficult keep at a lowest level of vacuum to minimize contamination. Thus, what is needed are systems and methods for handling and processing larger substrates using existing equipment.

SUMMARY OF THE INVENTION

In aspects of the invention, a dual Selective Compliant Assembly Robot Arm (SCARA) robot is provided. The robot comprises two SCARAs each including an elbow joint, wherein the two SCARAs are vertically stacked such that one SCARA is a first arm and the other SCARA is an second arm, and wherein the second arm is adapted to support a first substrate, and the first arm is adapted to extend to a full length when the second arm supports the first substrate, and wherein the first substrate supported by the second arm is coplanar with the elbow joint of the first arm, and the second arm is further adapted to move concurrently in parallel (and/or in a coordinated fashion) with the first arm a sufficient amount to avoid interference between the first substrate and the elbow joint of the first arm.

In other aspects of the invention, a dual Selective Compliant Assembly Robot Arm (SCARA) robot is provided. The robot comprises two SCARAs each including an elbow joint, wherein one SCARA is a first arm and the other SCARA is a second arm, and wherein the first and second arms are adapted to reach into the same slit valve, and wherein the second arm is adapted to support a substrate, and the first arm is adapted to extend to a full length when the second arm supports the substrate, and wherein the substrate supported by the second arm is coplanar with the elbow joint of the first arm, and the second arm is further adapted to move concurrently in parallel (and/or in a coordinated fashion) with the first arm a sufficient amount to avoid interference between the substrate and the elbow joint of the first arm.

In yet other aspects of the invention, a method is provided. The method comprises providing a dual SCARA robot including a first and second arm; supporting a first substrate on an end effector coupled to the second arm of the SCARA robot; extending the first arm of the SCARA robot to the first arm's full length; and moving the second arm concurrently with the extending first arm, wherein the second arm is moved a sufficient amount to avoid interference between the first substrate and the first arm.

In still other aspects of the invention a system is provided. The system comprises one or more transfer chambers, wherein each of the one or more transfer chambers has one or more dual SCARA robots disposed there; one or more processing chambers connected to the one or more transfer chambers; at least one factory interface connected to the one or more transfer chambers; and wherein each of the one or more dual SCARA robots comprises a first arm and a second arm, wherein the second arm is adapted to support a substrate; and the first arm is adapted to extend to a full length when the second arm supports the substrate, wherein the substrate supported by the second arm is coplanar with an elbow joint of the first arm, and the second arm is further adapted to move concurrently in parallel (and/or in a coordinated fashion) with the first arm a sufficient amount to avoid interference between the substrate and the elbow joint of the first arm.

Other features and aspects of the present invention will become more fully apparent from the following detailed description, the appended claims and the accompanying drawings.

BRIEF DESCRIPTION OF THE DRAWINGS

FIGS. 5A and 5B are top schematic views of a dual SCARA robot adapted to employ embodiments of the present invention.

DETAILED DESCRIPTION

The present invention provides systems and methods for extending the reach of a dual Selective Compliant Assembly Robot Arms (SCARA) robot. Dual SCARA robots may include two SCARAs that are stacked vertically and share a single vertical motion driver. Both SCARAs may be adapted to be coordinated with each other so that movements of the arms do not interfere (e.g., collide) with each other when the arms are moving in the same direction. However, in some applications, such as substrate transfer chambers, movements of the arms may need to be further coordinated/limited or restricted to prevent the arms from colliding with the substrates being moved. The invention enables a first arm to unfold or extend without contacting or interfering with a second arm, or even a substrate being held by the second arm.

SCARA and dual SCARA arms are used in many applications within the semiconductor and other industries. Examples of prior art robots for the use of SCARA linkage within the semiconductor industry include U.S. Pat. No. 6,485,250, US2001036398A1, and US2006099063A1, each of which are hereby incorporated herein by reference.

Figure 1:
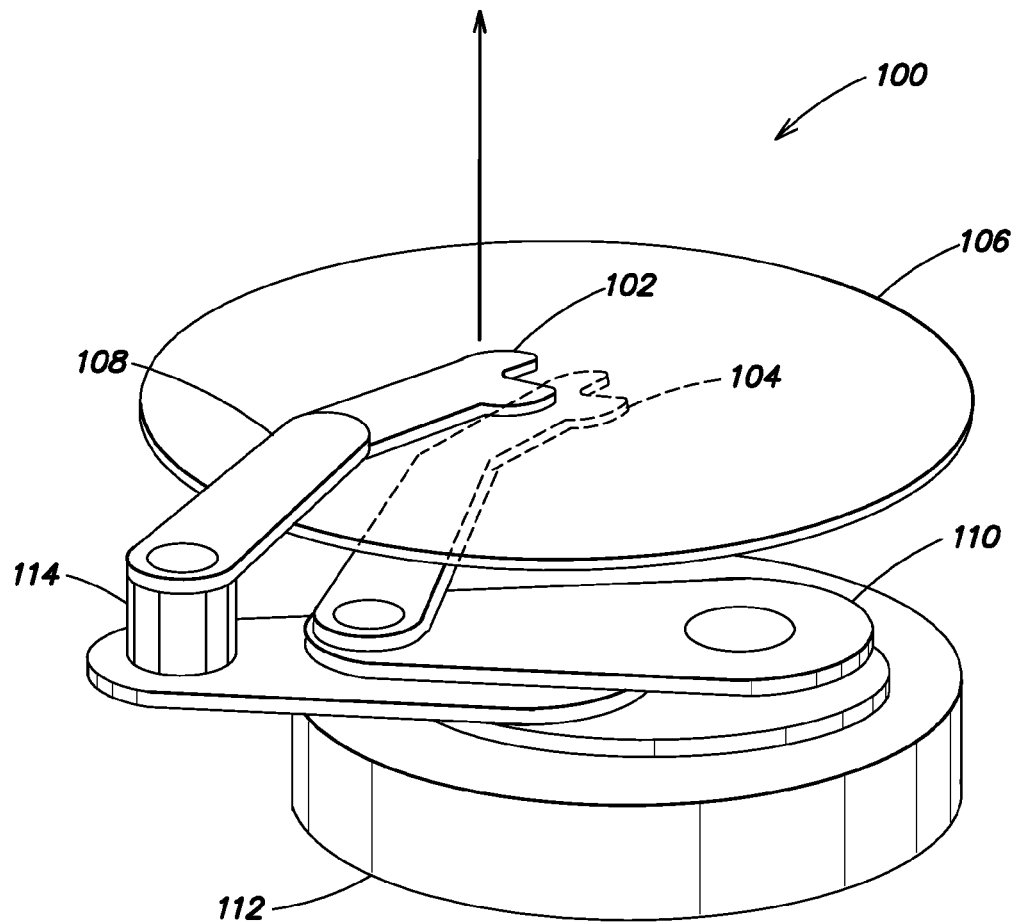
FIG. 1 is a prior art view of a dual SCARA robot.

For example, shown in FIG. 1, a prior art dual SCARA robot 100 is provided. The robot 100 may include a first and second blade or end effector 102, 104, respectively, for holding a substrate 106. Each blade 102, 104 may be mounted on an independently controllable robot arm 108, 110 coupled to a common robot base 112. As further described below, the robot 100 is configured to shuttle substrates in a substantially horizontal orientation among the processing chambers. However, when larger substrates 106 are used, or during extended reach applications in the transfer chambers, as the first arm 108 and hence first blade 102 move forward (indicated by the arrow pointing to the top of the page) and straighten out, a first elbow 114 may contact the substrate 106 being held on the second blade 104. In other words, as the first robot arm 108 unfolds to extend its reach and form more of a vertical line, the joints (or "elbow") 114 of the extending first arm 108 may contact the substrate 106 being held by the second robot arm 110. This contact or interference may occur because the different segments forming each arm may not be in the same plane due to the construction of the arm. Thus, in conventional dual SCARA robot systems, the first or upper robot arm 108 may not be able to extend fully and reach the limits of the work area, or envelope, when the second or bottom robot arm 110, extended or otherwise, is supporting the substrate 106. In other words, when two or more robot transfer arms are operated within the same confined space, in the prior art it is not uncommon to first move one arm out of the path of another before moving the other arm to avoid collision.

Therefore, in the present invention, when larger substrates are used, or during extended reach applications in the transfer chambers, the reach of the first robot arm may need to be limited or coordinated with the movement of the second robot arm to prevent one of the first robot arm's joints (or "elbows") from contacting a substrate held by the second robot arm. Embodiments of the present invention may allow for the extended reach of a first arm of a dual SCARA robot by moving the second arm, supporting a substrate, in the same direction (or opposite direction) of the extending first arm synchronously with the motion of the extending first arm. The present invention described herein allows the first arm to be extended fully when a substrate is present on the second arm, which provides a significant advantage by eliminating design limitations and sequence restrictions imposed by prior art robots. As will be further described below, in some embodiments, the orientation of the first and second arms may be reversed.

Figure 2:
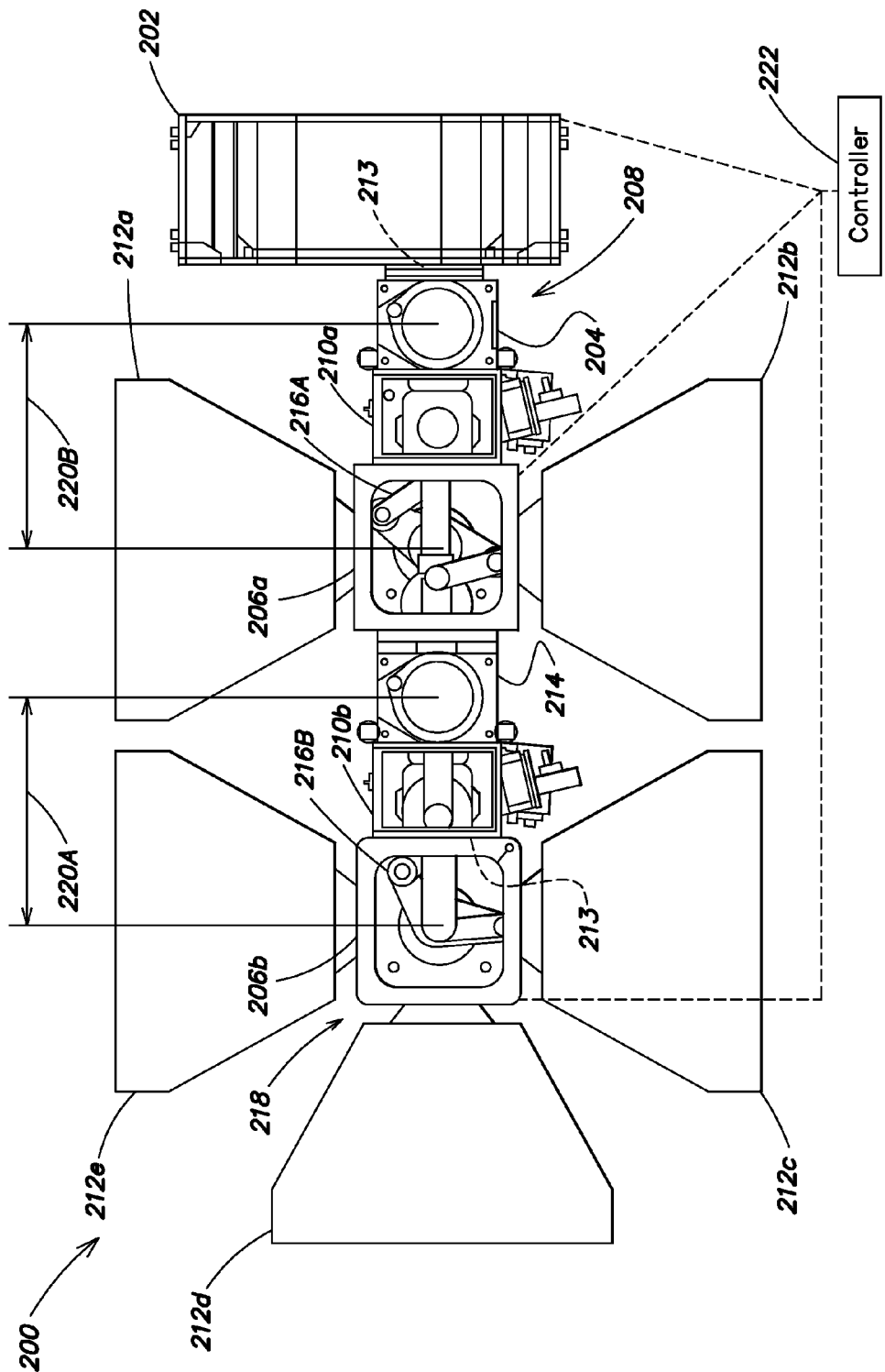
FIG. 2 is a top plan view of an example tool including two dual SCARA robots adapted to employ embodiments of the present invention.

Turning to FIG. 2, a plan view of a tool 200 is provided. The tool 200 may comprise multiple processing chambers 212 coupled to a mainframe comprising two transfer chambers 206. In some embodiments, the tool 200 may comprise a factory interface 202 in selective communication with a load lock chamber 204. In some embodiments, the factory interface 202 may include one or more input/output (I/O) chambers (or "load lock" chambers). The I/O chambers may be adapted to have attached to them substrate-holding substrate carriers (not shown), each of which may include one or more shelves for housing one or more substrates. Within each I/O chamber is a mechanism (not shown and well known in the art) for moving a selected substrate from the shelf in the carrier to a designated level at which a robot (described below) can remove the substrate from the I/O chamber. The robot may then bring the substrate into a transfer chamber 206 for subsequent processing.

In some embodiments, the load lock chamber 204 may provide a vacuum interface between the factory interface 202 and a first transfer chamber assembly 208. An internal region of the first transfer chamber assembly 208 may be typically maintained at a vacuum condition and provides an intermediate region in which to shuttle substrates from one chamber to another and/or to the load lock chamber 204.

In some embodiments, the first transfer chamber assembly 208 may be divided into two parts. In some embodiments, the first transfer chamber assembly 208 comprises the first transfer chamber 206a and a first vacuum extension chamber 210a. The first transfer chamber 206a and the first vacuum extension chamber 210a may be coupled together and in fluid communication with one another. An inner volume of the first transfer chamber 206a may be typically maintained at a low pressure or vacuum condition during processing.

In some embodiments, the first transfer chamber 206a may be a polygonal structure having a plurality of sidewalls, a bottom and a lid. The plurality of sidewalls may have openings formed therethrough and may be configured to connect with processing chambers, vacuum extension and/or other pass through chambers. The first transfer chamber 206a shown in FIG. 2 has a square or rectangular shape and is coupled to processing chambers 212a and 212b, a pass through chamber 214 and the first vacuum extension chamber 210a.

An exemplary transfer chamber 206a may be one commercially available from Applied Materials, Inc. of Santa Clara, Calif. Any other suitable transfer chambers may be used. In some embodiments the transfer chamber 206a may include a dual SCARA robot 216A adapted to move substrates (e.g., silicon wafers (shown in FIG. 3), semiconductor processing imaging plates (e.g. masks or reticles), solar panels) between different processing chambers 212a-e and the factory interface 202, for example. As will be described below, although two dual SCARA robots 216A, 216B; five processing chambers 216a-e; and one factory interface 202 are depicted in FIG. 2, any number of robots, processing chambers, and factory interfaces may be included.

In some embodiments, the dual SCARA robot 216A may be mounted in the first transfer chamber 206a at a robot port (not shown) formed on the floor or bottom of the transfer chamber 206a and sealed around an access opening (not shown) in the floor. In other embodiments, the dual SCARA robot 216A may not be mounted in the first transfer chamber 206a but instead mounted on a mobile apparatus, such as a track, for example. The robots 216A and 216B may be configured to shuttle substrates among the processing chambers 212a-e, the pass through chamber 214 and the load lock chamber 204, as will be further described with respect to FIGS. 3 to 5B. The first vacuum extension chamber 210a may be configured to provide an interface to a vacuum system to the first transfer chamber assembly 208.

In some embodiments, the first vacuum extension chamber 210a comprises a bottom, a lid and sidewalls. A pressure modification port may be formed on the bottom of the first vacuum extension chamber 210a and may be configured to adapt to a vacuuming pump system. Openings may be formed on the sidewalls so that the first vacuum extension chamber 210a is in fluid communication with the transfer chamber 206a, and in selective communication with the load lock chamber 204. In some embodiments, the tool 200 may be configured to deposit a film on semiconductor substrates using physical vapor deposition (PVD) process. During conditioning operations, a dummy substrate or a shutter disk (not shown) may be disposed on a pedestal (not shown) to protect the substrate support from any deposition.

In some embodiments, the tool 200 may further comprise a second transfer chamber assembly 218 by the pass through chamber 214. The second transfer chamber assembly 218 may include features similar to the first transfer chamber assembly 208, described above. In some embodiments, the pass through chamber 214 may be similar to the load lock chamber 204, and may be configured to provide an interface between two processing environments. For example, the pass through chamber 214 may provide a vacuum interface between the first transfer chamber assembly 208 and the second transfer chamber assembly 218.

Similarly to the first transfer chamber assembly 208 described above, the second transfer chamber assembly 218 may be divided into two parts—a second transfer chamber 206b and a second vacuum extension chamber 210b in fluid communication with one another. As shown herein, the second transfer chamber 206b may be in selective communication with the processing chambers 212c-e. The second dual SCARA robot 216B may be positioned in the second transfer chamber 206b.

In some embodiments, the required reach for each robot 216A, 216B may be relatively short when accessing adjacent processing chambers 212. However, each robot 216A, 216B may also be required to extend further distances 220A and 220B, respectively, to reach nonadjacent chambers.

As indicated above, the dual SCARA robots 216A, 216B may be used to remove one or more substrates from the I/O chamber, and insert the substrates into the processing chambers 212a-e. The types of processing chambers 212a-e may include, for example, material deposition, etching, masking, lithography and heating chambers. Other processing chambers may be used. The robots 216A, 216B may also be used to transfer the substrates between processing chambers 212a-e. Once the substrate processing is complete, the robots 216A, 216B may return the substrate to the I/O chamber/factory interface 202 and ultimately a respective substrate carrier, for example.

In some embodiments, the transfer chambers 206a-b may be in selective communication with the processing chambers 212a-e and factory interface 202 via slit valves 213, which may be located in a wall of the transfer chambers 206a-b and are automatically opened and closed to permit the transfer of substrates (shown in FIG. 3) to or from the chambers. Such slit valves 213 are well known in the art and are not further described herein.

A controller 222 may be hardwired or wirelessly coupled to the robots 216A, 216B and factory interface 202. In some embodiments, the controller 222 may be coupled to the processing chambers 212a-e (not shown). The controller 222 may be adapted to control the operation of the robots 216A, 216B. For example, the controller 222 may control the ordered sequencing in the operation of the robots 216A, 216B, the robot arms (described below), and the slit valve 213. The controller 222 may also selectively manipulate operation of other system components. In some embodiments the controller 222 may be an integral part of, and contained in, the tool 200, while in other embodiments the controller 222 may be apart and separate from the tool 200. The controller 222 may be a microcomputer, microprocessor, logic circuit, a combination of hardware and software, or the like. The controller 222 may include various communications facilities including input/output ports, a keyboard, a mouse, a display, a network adapter, etc.

Figure 3A:
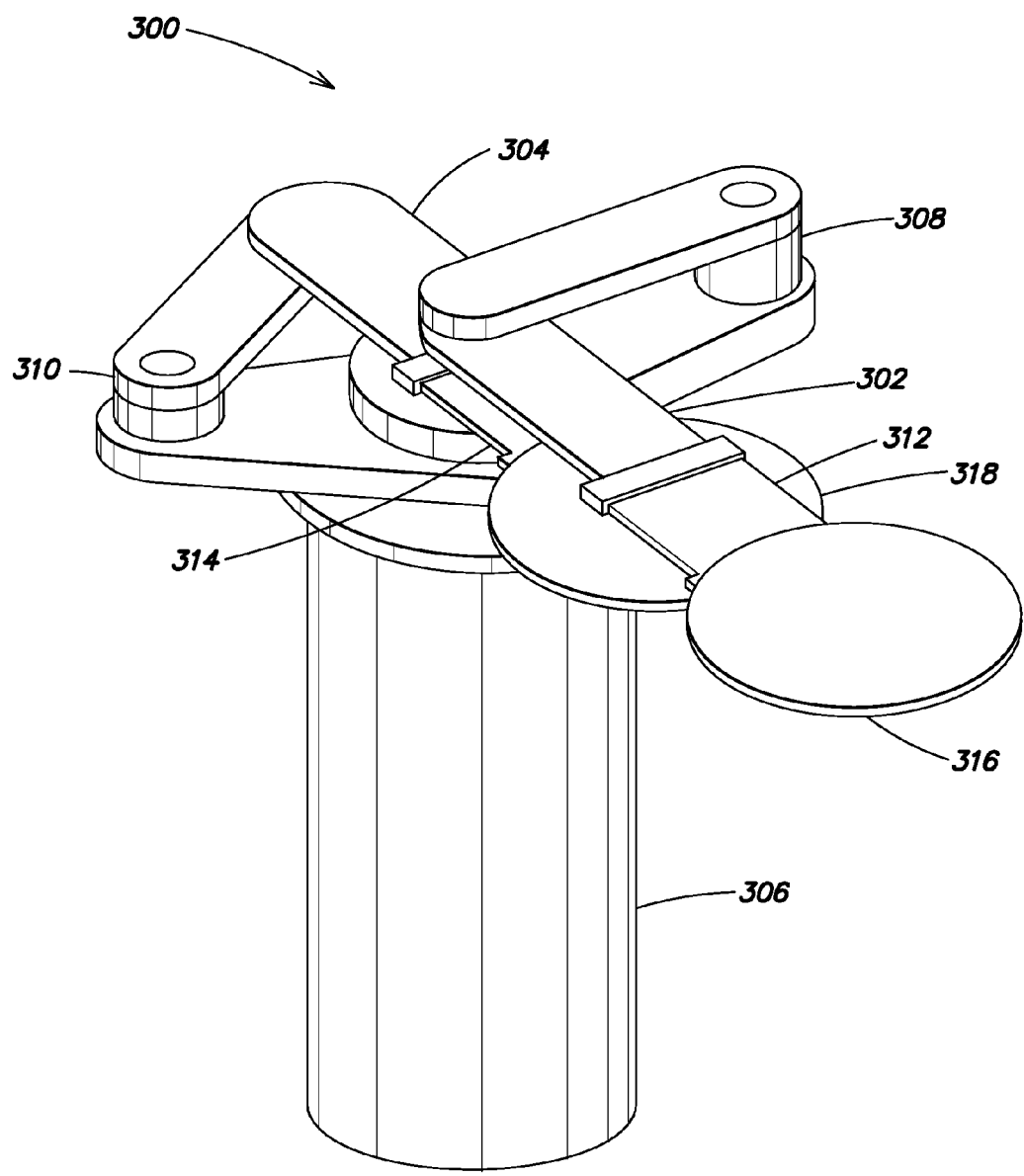
FIG. 3A is a perspective view of an example dual SCARA robot adapted to employ embodiments of the present invention.

Turning to FIG. 3A, a perspective view of an example dual SCARA robot 300 adapted to employ embodiments of the present invention is provided. As described above, the dual SCARA robot 300 (hereinafter "robot") may include a first arm 302 and a second arm 304 coupled to a common robot base 306. While the robot base 306 is shown to be below the first and second arms 302, 304 and proximate to the second arm 302, in alternative embodiments, the robot base 306 may be inverted such that the robot base 306 is effectively above the first and second arms 302, 304, but still proximate to the second arm 302. In some embodiments, the first and second arms 302, 304 may be coupled to the robot base 306 via a nested shaft 301, for example, shown in FIG. 3B and described further below. In alternate embodiments, instead of the nested shaft 301, each of the first and second arms 302, 304 may be coupled to an individual driver, wherein each driver may be adapted to extend and retract the first and second arms 302, 304. In the individual driver embodiment, a third driver may be included, wherein the third driver may be adapted to rotate the robot 300, such that the robot 300 may access different chambers, for example. Other suitable coupling mechanisms may be used. Each of the first and second arms 302, 304 may include a first and second linkage elbow 308, 310, respectively (hereinafter "elbow"). Additionally, in some embodiments, each of the first and second arms 302, 304 may include a first and second end effector 312, 314, respectively, at an end thereof. The first and second end effectors 312, 314 may each be adapted to support a first and second substrate 316, 318.

Figure 3B:
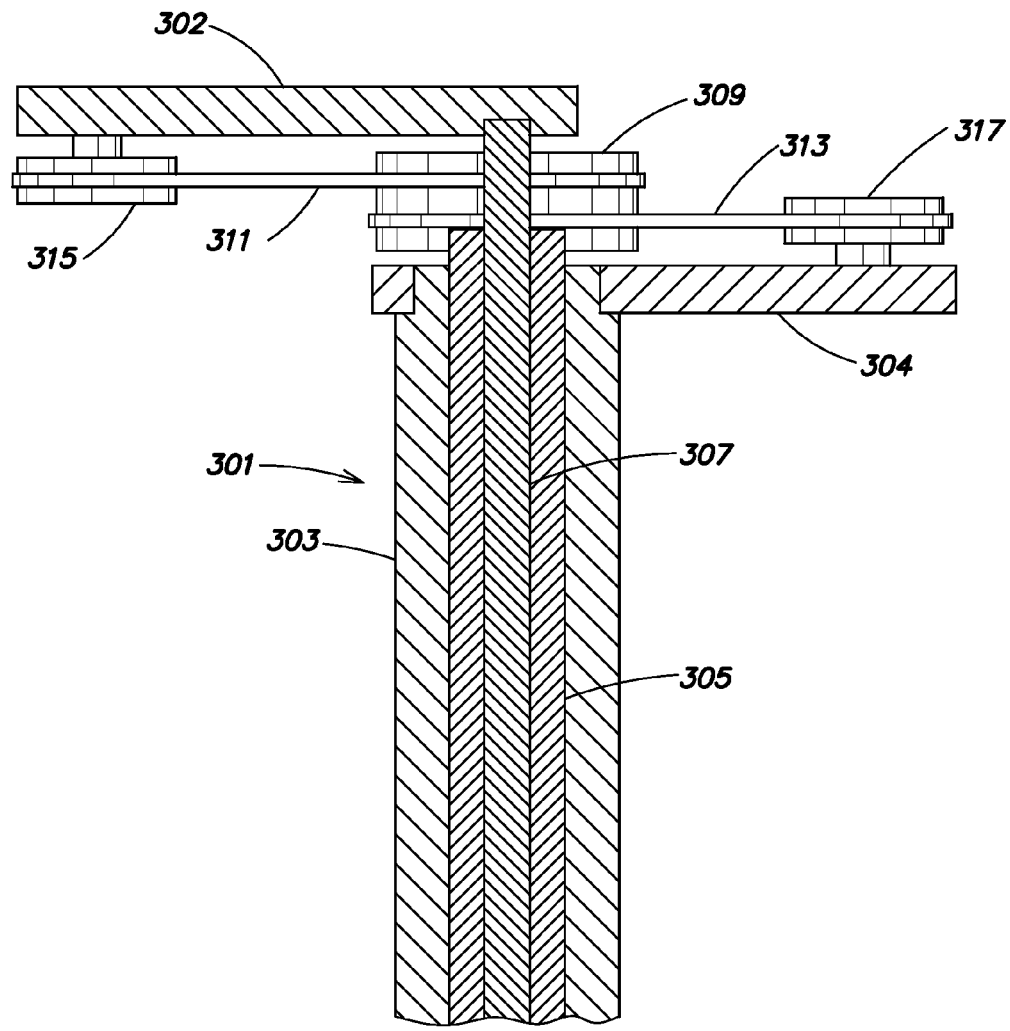
FIG. 3B is a cross-sectional view of an exemplary robot base adapted to employ embodiments of the present invention.

As shown in FIG. 3B, in some embodiments the nested shaft 301 may include an outside shaft 303, a central shaft 305 and an inside shaft 307. The first arm 302 may be coupled to the inside shaft 307, for example. The first arm 302 may also be coupled to the central shaft 305 via a first arm drive belt 311 and a first elbow pulley 315, for example. The second arm 304 may be coupled to the outside shaft 303. The second arm 304 may also be coupled to the central shaft 305 via a second drive belt 313 and a second elbow pulley 317, for example. Other suitable coupling mechanisms may be used.

Figure 4B:
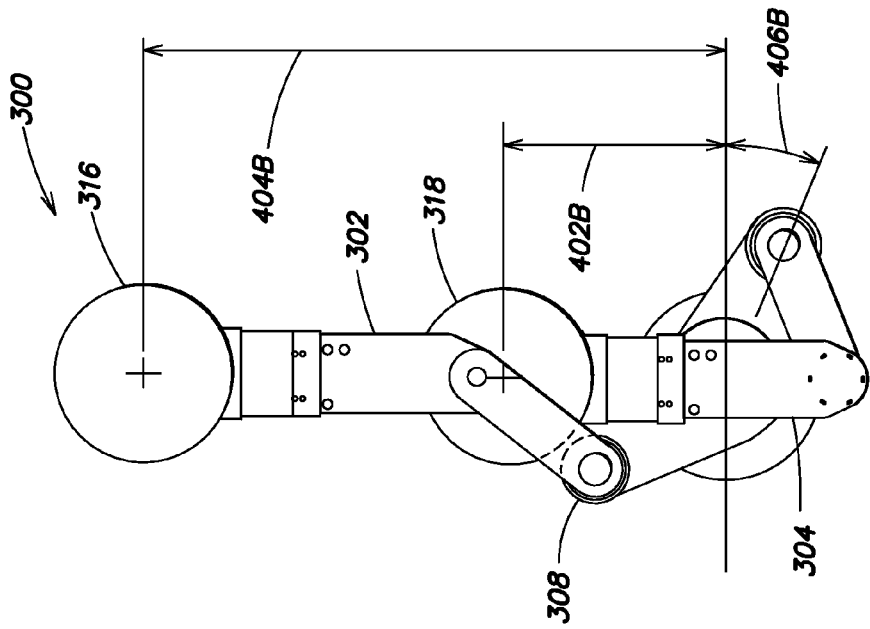
FIGS. 4A and 4B are a top plan comparative view of a dual SCARA robot adapted to employ embodiments of the present invention next to a conventional dual SCARA robot that has not been adapted to employ the present invention.
Figure 4A:
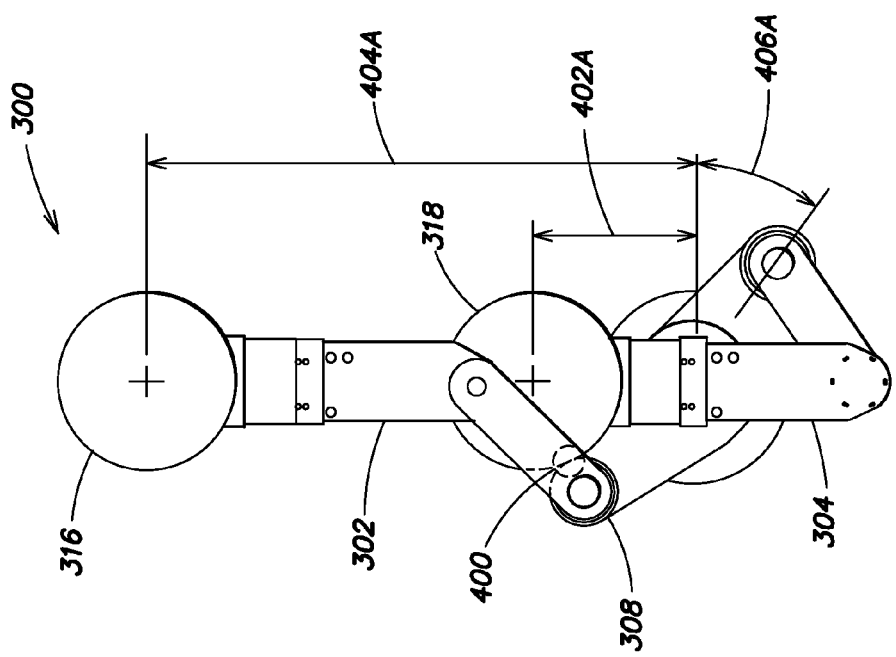

Turning to FIGS. 4A and 4B, schematic plan views of the dual SCARA robot 300, shown in FIG. 3, is provided. As described above, the robot 300 is capable of the longest required reach with both the first and second arms 302, 304. However, in conventional or prior art systems (FIG. 4A), an interference 400 may exist between the first elbow 308 and the second substrate 318 on the second end effector 314 (covered by the second substrate 318) when the first arm 302 is extended to position 404A and the second arm 304 is supporting the second substrate 318. According to the present invention (FIG. 4B), in order to avoid this interference 400 when the second substrate 318 is present on the second end effector 314 of the second arm 304, the second arm 304 may be extended slightly from position 402A to position 402B, allowing the first arm 302 to extend fully to position 404B without colliding with the second substrate 318 on the second arm 304. As the second arm 304 extends to 402B with the first arm 302 in FIG. 4B, an angle of movement 406B of the second arm 304 may be reduced compared to an angle of movement 406A of the second arm in FIG. 4A, to avoid interference 400. In an alternate embodiment, the second arm 304 may be retracted back (towards the bottom of the page), thereby decreasing the angle of movement 406A and making 402a extend towards the bottom of the page, to avoid interference 400. However, this may be undesirable as the space "behind" the robot 300 may be unavailable. According to embodiments of the invention, the short movement of the second arm 304 from position 402A to position 402B occurs concurrently (e.g., synchronously) and in parallel with the longer movement (e.g., extension) of the first arm 302 from position 404A to 404B. After the handoff of the first substrate 316, both the first and second arms 302 and 304 may then be retracted concurrently (e.g., synchronously) and in parallel until both first and second end effectors 312, 314 (FIG. 3) and first and second arms 302, 304 are located at a starting retracted position. In some embodiments, when both the first and second arms 302, 304 are in the retracted position, the entirety of the first and second arms 302, 304 and first and second end effectors 312, 314 may fit within a space as large as the circumference of a surface of the robot base 306 proximate the second arm 304, such that the entire robot 300 may be rotated about the base 306, to position the robot 300 in front of different processing chambers 212a-e, for example.

Turning to FIGS. 5A and 5B, a schematic plan view of the tool 200 of FIG. 2 is provided wherein the first arm 302 of the robot 300, shown in FIG. 3, is accessing the load lock chamber 204 connected to the transfer chamber 206a through the first vacuum extension chamber 210b, and the second arm 304 is accessing the vacuum extension chamber 210b, for example. As described above, the short movement of the second arm 304 occurs in synchronously and in parallel with the longer movement (e.g., extension) of the first arm 302.

In some embodiments, the movement of the second arm 304 may only be made in the specific scenario where the second substrate 318 is present on the second end effector 314 of the second arm 304 and when it is necessary to extend the first arm 302, and hence first end effector 312, beyond position 404A (FIG. 4). It may not necessary to move the first arm 302 when the second arm 304 is extended fully as shown in FIG. 5B, since the second elbow 310 does not interfere with the first substrate 316 on the first end effector 312 of the first arm 302. In some embodiments, the first and second arms may be reversed, for example, in the embodiment of the inverted robot base 306. In the inverted robot base 306 embodiment, for example, when the first substrate 316 is present on the first end effector 312, as the second arm 304 is extended, the first arm 302 moves the "short movement" in synchronously and in parallel with the extension of the second arm 304, to prevent the second elbow 310 from contacting the first substrate 316.

Figure 6:
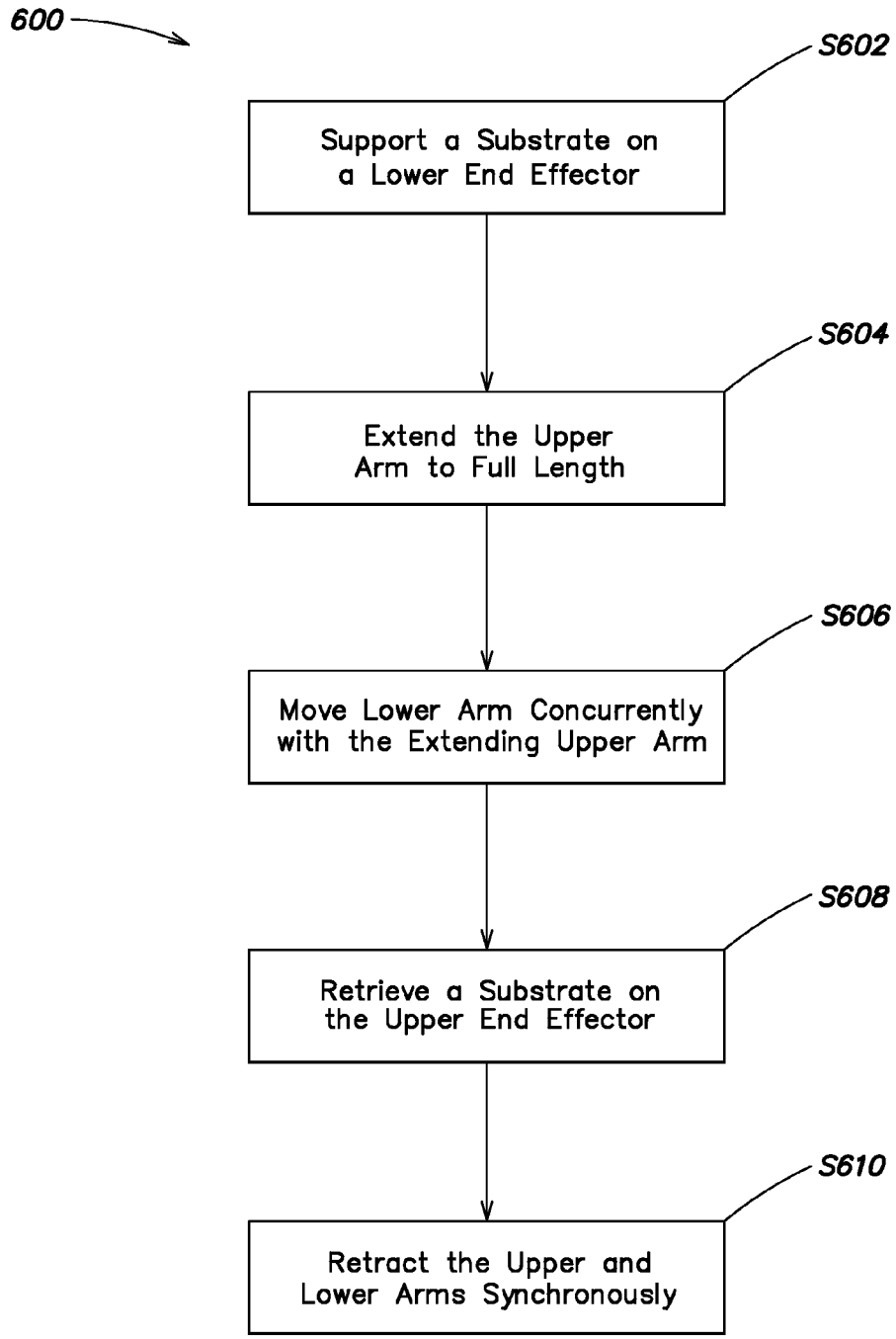
FIG. 6 is a flow chart illustrating an exemplary method for operating the dual SCARA robots in accordance with an embodiment of the present invention.

Turning to FIG. 6, an exemplary method 600 for operating the dual SCARA robot 300 of the present invention is provided. In step S602, the second substrate 318 may be supported on the second end effector 314 of the second arm 304. In step S604, the first arm 302 may be extended to full length 404B. As the first arm 302 is extended to full length 404B, the second arm 304 may be moved concurrently with the extending first arm 302 in step S606. As indicated above, the movement may be reversed in the inverted robot base 306 embodiment. In step S608, the first end effector 312 of the first arm 302 retrieves the first substrate 316 from the processing chamber 212a-e, load lock 204 or pass through chamber 214, for example. In step S610, both the first and second arms 302, 304 retract synchronously.

Further, it should be understood that although only examples of transporting a round substrate are disclosed, the present invention could be modified to transport substrates having other shapes (e.g., a glass or polymer plate for flat panel displays, or solar panels). Further, although processing of one and two substrates by the apparatus is shown above, in some embodiments, the apparatus may process a plurality of substrates concurrently.

The foregoing description discloses only exemplary embodiments of the invention. Modifications of the above disclosed apparatus and methods which fall within the scope of the invention will be readily apparent to those of ordinary skill in the art. Accordingly, while the present invention has been disclosed in connection with exemplary embodiments thereof, it should be understood that other embodiments may fall within the spirit and scope of the invention, as defined by the following claims.

The invention claimed is:

1. A dual Selective Compliant Assembly Robot Arm (SCARA) robot comprising:
   two SCARAs each including an elbow joint, wherein the two SCARAS are vertically stacked such that one SCARA is a first arm and the other SCARA is a second arm,
   a first end effector coupled to the first arm and a second end effector coupled to the second arm; and
   wherein the second end effector of the second arm supports a first substrate, and the first arm extends to a full length when the second end effector of the second arm supports the first substrate, and
   a controller,
   wherein the second end effector of the second arm supporting the first substrate is coplanar with the elbow joint of the first arm such that the first substrate is coplanar with the elbow joint of the first arm, and the controller controls the second arm, second end effector and the first substrate supported thereon to move in a same direction concurrently and coordinated with the first arm a sufficient amount to avoid interference between the first substrate and the elbow joint of the first arm.

2. The dual SCARA robot of claim 1 wherein the first end effector of the first arm is adapted to support a second substrate.

3. The dual SCARA robot of claim 1 wherein the second arm is capable of extending to a full length.

4. The dual SCARA robot of claim 3 wherein the full length extension of the second arm avoids interference between the elbow joint of the second arm and a second substrate supported by the first arm.

5. The dual SCARA robot of claim 1 wherein the concurrent movement of the second arm and first arm is synchronous.

6. The dual SCARA robot of claim 1 wherein the first arm is adapted to retract from the full length extension and the second arm is adapted to retract from the sufficient amount to avoid interference.

7. The dual SCARA robot of claim 6 wherein the retraction is synchronous.

8. A dual Selective Compliant Assembly Robot Arm (SCARA) robot comprising:
    two SCARAS each including an elbow joint, wherein one SCARA is a first arm and the other SCARA is an second arm,
    a first end effector coupled to the first arm and a second end effector coupled to the second arm, and
    wherein the first and second arms and respective end effectors are adapted to reach into a same slit valve, and
    wherein the second end effector of the second arm supports a first substrate, and the first end effector of the first arm extends to a full length while the second end effector of the second arm supports the first substrate, and
    a controller,
    wherein the second end effector of the second arm supporting the first substrate is coplanar with the elbow joint of the first arm such that the first substrate is coplanar with the elbow joint of the first arm, and the controller controls the second arm, and second end effector with the first substrate supported thereon to move in a same direction concurrently and coordinated with the first arm a sufficient amount to avoid interference between the first substrate and the elbow joint of the first arm.

9. The dual SCARA robot of claim 8 wherein the first end effector of the first arm is adapted to support a second substrate.

10. The dual SCARA robot of claim 8 wherein the second arm is capable of extending to a full length.

11. The dual SCARA robot of claim 8 wherein the concurrent movement of the first arm and the second arm is synchronous.

12. The dual SCARA robot of claim 1 wherein the first and second arms are adapted to retract.

13. The dual SCARA robot of claim 12 wherein the retraction is synchronous.

14. A method comprising:
    providing a dual SCARA robot including a first and second arm;
    providing a first end effector coupled to the first arm and a second end effector coupled to the second arm;
    supporting a first substrate on the second end effector coupled to the second arm of the SCARA robot;
    extending the first arm of the SCARA robot to the first arm's full length; and
    controlling a sequence of the first and second robot arms, wherein moving the second arm concurrently and in a same direction with the extending first arm moves the second arm with the first substrate supported on the second end effector a sufficient amount to avoid interference between the first substrate on the second end effector and a coplanar elbow joint of the first arm.

15. The method of claim 14, wherein the first arm is extended to receive a second substrate on the end effector coupled to the first arm.

16. The method of claim 14 further comprising:
    depositing the first substrate into a processing chamber.

17. The method of claim 16 further comprising:
    retracting the first and second arms synchronously.

18. The method of claim 16 further comprising:
    retracting the first and second arms in parallel.

19. The method of claim 14, further comprising extending the second arm a full length when the first arm is retracted.

20. A system comprising:
    one or more transfer chambers, wherein each of the one or more transfer chambers has one or more dual SCARA robots disposed there;
    one or more processing chambers connected to the one or more transfer chambers;
    at least one factory interface connected to the one or more transfer chambers; and
    a controller adapted to operate the one or more dual SCARA robots,
    wherein each of the one or more dual SCARA robots comprises a first arm and a second arm, and the first arm has a first end effector coupled thereto, and the second arm has a second end effector coupled thereto, wherein the second end effector of the second arm is adapted to support a substrate; and the first arm is adapted to extend to a full length when the second end effector of the second arm supports the substrate, wherein the second end effector of the second arm supporting the substrate is coplanar with an elbow joint of the first arm such that the substrate is coplanar with the elbow joint of the first arm, and the controller controls the second arm, and second end effector with the substrate supported thereon to move in a same direction concurrently and coordinated with the first arm a sufficient amount to avoid interference between the substrate and the elbow joint of the first arm.

21. The system of claim 20 wherein the controller is adapted to control the movement of the first and second arms.

22. The system of claim 20 wherein the concurrent movement of the first arm and second arm is synchronous.

23. The system of claim 20 wherein the first and second arms are adapted to retract.

24. The system of claim 23 wherein the retraction is in parallel and synchronous.

* * * * *